US009520322B2

(12) United States Patent
Hayashi et al.

(10) Patent No.: US 9,520,322 B2
(45) Date of Patent: Dec. 13, 2016

(54) SEMICONDUCTOR DEVICE AND METHOD FOR MANUFACTURING SAME

(71) Applicant: TOPPAN PRINTING CO., LTD., Tokyo (JP)

(72) Inventors: Kenta Hayashi, Tokyo (JP); Katsumi Yamamoto, Tokyo (JP); Makoto Nakamura, Tokyo (JP); Naoyuki Akiyama, Tokyo (JP); Kyosuke Taguchi, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

(21) Appl. No.: 14/321,963

(22) Filed: Jul. 2, 2014

(65) Prior Publication Data

US 2014/0312506 A1    Oct. 23, 2014

Related U.S. Application Data

(63) Continuation of application No. PCT/JP2012/084110, filed on Dec. 28, 2012.

(30) Foreign Application Priority Data

Jan. 6, 2012   (JP) .................................. 2012-001155

(51) Int. Cl.
*H01L 21/768*   (2006.01)
*H01L 23/48*    (2006.01)
(Continued)

(52) U.S. Cl.
CPC ..... *H01L 21/76814* (2013.01); *H01L 21/3065* (2013.01); *H01L 21/30655* (2013.01);
(Continued)

(58) Field of Classification Search
CPC ........... H01L 21/7614; H01L 21/76816; H01L 21/76877; H01L 23/481; H01L 21/76814; H01L 21/76897; H01L 21/76805; H01L 21/486
(Continued)

(56) References Cited

U.S. PATENT DOCUMENTS 6,617,681 B1 *   9/2003   Bohr ............................. 257/700
6,960,837 B2 *   11/2005  Iadanza ........................ 257/774
(Continued)

FOREIGN PATENT DOCUMENTS

JP   2003-503855    1/2003
JP   2003-318178    11/2003
(Continued)

OTHER PUBLICATIONS

International Search Report mailed Mar. 12, 2013 in corresponding International Application No. PCT/JP2012/084110.
(Continued)

*Primary Examiner* — Christine Enad

(57) ABSTRACT

A semiconductor device includes a semiconductor substrate including a first surface in which an integrated circuit and an I/O pad electrically connected to the integrated circuit are formed, and a second surface which is an opposite side to the first surface, where a two-stage through-hole is formed in the semiconductor substrate, the semiconductor substrate including a first shape portion having a tapered shape which has a wall surface and of which a diameter of an opening becomes smaller toward a bottom of the hole from the second surface side to a predetermined position of the semiconductor substrate in a thickness direction, and including a second shape portion having a cylindrical shape which extends from the first shape portion to the I/O pad on the first surface side, and that includes an inorganic insulating film
(Continued)

which is formed on the wall surface of the two-stage through-hole and the second surface.

9 Claims, 8 Drawing Sheets

(51) Int. Cl.
*H01L 21/3065* (2006.01)
*H01L 27/146* (2006.01)
*H01L 21/311* (2006.01)
*H01L 23/525* (2006.01)

(52) U.S. Cl.
CPC .. *H01L 21/31116* (2013.01); *H01L 21/76816* (2013.01); *H01L 21/76877* (2013.01); *H01L 21/76898* (2013.01); *H01L 23/481* (2013.01); *H01L 27/14618* (2013.01); *H01L 27/14636* (2013.01); *H01L 27/14683* (2013.01); *H01L 23/525* (2013.01); *H01L 2224/02372* (2013.01); *H01L 2224/0401* (2013.01); *H01L 2224/05548* (2013.01); *H01L 2224/131* (2013.01); *H01L 2224/13022* (2013.01); *H01L 2224/13024* (2013.01)

(58) Field of Classification Search
USPC .......................................... 257/774; 438/667
See application file for complete search history.

(56) References Cited

U.S. PATENT DOCUMENTS

| | | | |
|---|---|---|---|
| 2004/0016942 A1* | 1/2004 | Miyazawa et al. | 257/200 |
| 2006/0046463 A1* | 3/2006 | Watkins | H01L 21/76898 |
| | | | 438/622 |
| 2006/0094231 A1 | 5/2006 | Lane et al. | |
| 2007/0247260 A1* | 10/2007 | Yanase et al. | 333/187 |
| 2008/0283951 A1* | 11/2008 | Nabe et al. | 257/433 |
| 2009/0309235 A1* | 12/2009 | Suthiwongsunthorn | H01L 23/3114 |
| | | | 257/777 |
| 2010/0013060 A1 | 1/2010 | Lamy et al. | |
| 2011/0018040 A1* | 1/2011 | Smith et al. | 257/288 |
| 2011/0291153 A1 | 12/2011 | Yang et al. | |

FOREIGN PATENT DOCUMENTS

| | | |
|---|---|---|
| JP | 2005-311117 | 11/2005 |
| JP | 2007-053149 | 3/2007 |
| JP | 2007-311771 | 11/2007 |
| JP | 2008-288309 | 11/2008 |
| JP | 2010-251791 | 11/2010 |
| JP | 2011-003863 | 1/2011 |
| WO | WO 01/01486 A1 | 1/2001 |

OTHER PUBLICATIONS

Extended European Search Report mailed Nov. 5, 2015 in related European Application No. 12864530.6.

* cited by examiner

SEMICONDUCTOR DEVICE AND METHOD FOR MANUFACTURING SAME

CROSS REFERENCE TO RELATED APPLICATIONS

This application is a continuation application based on a PCT Patent Application No. PCT/JP2012/084110, filed Dec. 28, 2012, whose priority is claimed on Japanese Patent Application No. 2012-001155 filed Jan. 6, 2012, the entire contents of which are hereby incorporated by reference.

BACKGROUND OF THE INVENTION

Field of the Invention

The present invention relates to a semiconductor device which can be manufactured at low cost and which includes a through-electrode having high connection reliability, and a method for manufacturing the same.

Description of the Related Art

In recent years, digital cameras and video cameras have been manufactured by mounting a solid-state imaging device including a semiconductor device such as a CCD or a CMOS to cameras. Further, regarding camera functions associated with cellular phones, a camera module constituted by a solid-state imaging device and a lens system has been built into cellular phones. A high-resolution solid-state imaging device which is small-sized, lightweight, and thin is required for these applications. Consequently, in order to realize a pixel count resolution of, for example, 10 million pixels using a small-sized solid-state imaging element, a fine pixel having a size of approximately several μm square has been manufactured.

Conventionally, a solid-state imaging device has been manufactured as follows (see Japanese Unexamined Patent Application, First Publication No. 2011-003863). First, a solid-state imaging element of an integrated circuit and a circuit pattern of an integrated circuit are created on the surface of a semiconductor substrate such as a silicon substrate by a single-sided exposure process. A glass substrate 20 is bonded to the surface of the semiconductor substrate, the thickness of the semiconductor substrate is reduced by polishing the substrate from the back surface thereof, and a through-hole (through-silicon via: hereinafter, abbreviated as a TSV) is processed on the semiconductor substrate.

Further, a conductive substance is formed on the inner wall of the TSV to form a through-electrode, and an electrical signal of image information obtained in a solid-state imaging element formed on the surface of the semiconductor substrate is sent to the back surface of the semiconductor substrate through the through-electrode. Electrical connection to an external circuit can be performed through a connection terminal 16 of a BGA (Ball Grid Array) formed on the back surface of the semiconductor substrate.

As described above, a single-sided exposure process of an element-forming surface is used for forming a semiconductor element on a semiconductor substrate such as a silicon substrate. However, a through-electrode in which a conductor layer is formed on the wall surface of a through-hole with an insulating film interposed therebetween is required for performing multi-layer lamination on a semiconductor chip. The through-hole is normally formed by a dry-etching method using plasma. However, since the etching depth is several times or more that in a normal semiconductor process, for example, 20 to 500 μm, the etching time also increases. For this reason, plasma exerts an influence on the semiconductor element formed on the semiconductor substrate. Exposure to plasma for a long period of time causes a rise in the temperature of the surface of the semiconductor substrate, or the occurrence of a defect in the semiconductor element due to an electric field of the plasma.

In addition, in order to shorten the time when the through-hole is formed so as to reach the back surface of the semiconductor substrate, chemical mechanical polishing (CMP) is performed on the back surface of the semiconductor substrate, or the thickness thereof is reduced by cutting off the back surface through etching. However, it takes time to cut off the back surface, and manufacturing costs increase.

In order to form the through-hole as described above at low cost, there is also a method of forming a photoresist for dry-etching having an opening for processing a hole through dry-etching, performing isotropic etching for processing the semiconductor substrate up to a portion located further outside than the opening, and forming a first hole having a tapered shape (see Japanese Unexamined Patent Application, First Publication No. 2007-053149). According to such a method, anisotropic etching is next performed, and a second hole is formed which has a perpendicular cylindrical wall surface with a diameter of an opening of the photoresist for dry-etching, from the bottom of the first hole having a tapered shape to an insulating film located at a position of an I/O pad 12 located below the semiconductor substrate. In this manner, the lower hole of a two-stage through-hole is formed up to the insulating film located at a position of the I/O pad 12.

In Japanese Unexamined Patent Application, First Publication No. 2007-053149, the following processes are described.

(1) An insulating film is formed on the wall surface and bottom of the lower hole of the two-stage through-hole, and an Al film for an etching resist is formed on the insulating film.

(2) A pattern of an etching resist having an opening at the bottom of the two-stage through-hole is formed on the Al film for an etching resist.

(3) The Al film exposed to an opening of the etching resist is etched by an etching solution.

(4) The etching resist is removed.

(5) Using the Al film having an opening at the bottom of the two-stage through-hole as a protective film of etching, the insulating film exposed to the opening portion is removed by dry-etching.

In the processes so far, the two-stage through-hole reaching the I/O pad 12 is manufactured.

(6) The Al film is removed.

(7) A conductor is formed on the wall surface of the two-stage through-hole which is connected to the I/O pad 12.

However, in the above method of Japanese Unexamined Patent Application, First Publication No. 2007-053149, a lot of processes are required for manufacturing the through-electrode, and manufacturing costs increase. In addition, since manufacturing processes are complicated, the yield rate of the through-electrode is reduced, and the reliability of the through-electrode deteriorates.

The present invention is contrived in view of the problems described above, and is to provide a semiconductor device including a through-electrode which is capable of being manufactured by a low-cost manufacturing method, and has high quality and high reliability.

A semiconductor device to which the present invention is applied is not limited to a package in which an integrated circuit element (IC-chip) is connected to an external circuit in a state where the element is sealed and held. The semiconductor device can also be applied to a printed substrate (for example, an interposer) in which a bare chip is mounted onto the upper surface and a terminal is included at the lower surface.

In addition, there are also various types of integrated circuit elements mounted in the package or the interposer. However, in the following description, a solid-state imaging element is chiefly illustrated by way of example.

SUMMARY OF THE INVENTION

According to one aspect of the present invention, a semiconductor device is provided, including: a semiconductor substrate having a first surface in which an integrated circuit and an I/O pad electrically connected to the integrated circuit are formed, and a second surface which is an opposite side to the first surface, where a two-stage through-hole is formed in the semiconductor substrate, the two-stage through-hole including a first shape portion having a tapered shape which has a wall surface and of which a diameter of an opening becomes smaller toward a bottom of the hole from the second surface side to a predetermined position of the semiconductor substrate in a thickness direction, and including a second shape portion having a cylindrical shape which extends from the first shape portion to the I/O pad on the first surface side; an inorganic insulating film which is formed on the wall surface of the two-stage through-hole and the second surface; a through-electrode of a metal layer which is formed on the I/O pad and the wall surface of the two-stage through-hole; and a wiring pattern formed on the second surface and connected to the through-electrode.

In the semiconductor device according to the above-described aspect of the present invention, a depth of the second shape portion is equal to or less than four times a diameter of the second shape portion.

In the semiconductor device according to the above-described aspect of the present invention, the first shape portion includes a tapered wall surface, and in a cross-section of the first shape portion, the tapered wall surface has a tilt with respect to the second surface which is equal to or greater than 60 degrees and equal to or less than 80 degrees.

The semiconductor device according to the above-described aspect of the present invention further includes a solder resist protecting the second surface and filled into the first shape portion.

In addition, according to one aspect of the present invention, a method for manufacturing a semiconductor device is provided, including: forming an integrated circuit and an I/O pad electrically connected to the integrated circuit on a first surface side of a semiconductor substrate; forming a pattern of a resist for dry-etching having an opening on a second surface side which is an opposite side to the first surface; forming a first shape portion opened from the second surface side to a predetermined position of the semiconductor substrate in a thickness direction so that a diameter of an opening of the first shape portion in the second surface side is larger than a diameter of an opening of the resist for dry-etching and the first shape portion is formed in a tapered shape of which a hole diameter of the first shape portion becomes smaller toward a bottom of the first shape portion, by dry-etching the semiconductor substrate in an RIE mode using a dry-etching apparatus using the resist for dry-etching as a mask; forming a second shape portion including a cylindrical wall surface with the same diameter as that of the opening of the resist for dry-etching which extends from the bottom of the first shape portion to the I/O pad, by performing dry-etching in a Bosch mode using the dry-etching apparatus using the resist for dry-etching as a mask; forming an inorganic insulating film using a chemical vapor deposition method, on a wall surface of a two-stage through-hole constituted by the first shape portion and the second shape portion and on the second surface; dry-etching an entire surface of the insulating film, and removing the insulating film located on the I/O pad while leaving the insulating film on the wall surface of the two-stage through-hole and on the second surface; forming a through-electrode by a metal film in the I/O pad and the wall surface of the two-stage through-hole; and forming a wiring pattern on the second surface which is connected to the through-electrode.

The method for manufacturing a semiconductor device according to the above-described aspect of the present invention further includes forming a solder resist for protecting the second surface, and filling the solder resist in the first shape portion.

According to the above-described aspect of the present invention, the two-stage through-hole constituted by the first shape portion having a tapered shape and the second shape portion having a perpendicular cylindrical wall surface is formed in the semiconductor substrate, thereby allowing a uniform high-quality inorganic insulating film to be formed in the wall surface and bottom of the two-stage through-hole using a chemical vapor deposition method.

In addition, dry-etching is performed on the entire surface of the insulating film, thereby allowing a structure in which the insulating film located on the I/O pad is removed to be formed at low cost while the insulating film is left on the wall surface of the two-stage through-hole and on the second surface of the semiconductor substrate. Further, the through-electrode of a uniform and high-quality metal film can be formed on the I/O pad and the wall surface of the two-stage through-hole. Therefore, a semiconductor device is obtained which is capable of being manufactured by a low-cost manufacturing method and in which a through-electrode having good quality and high reliability is formed.

DETAILED DESCRIPTION OF THE PREFERRED EMBODIMENTS

A semiconductor device according to an embodiment of the present invention will be described below in detail with reference to the accompanying drawings.

<First Embodiment>

Figure 1:
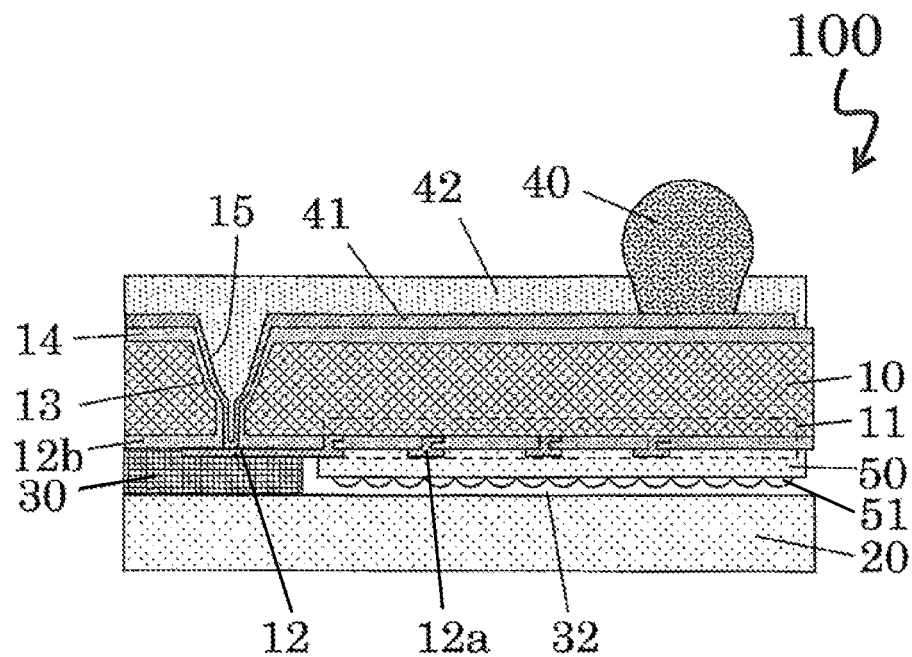
FIG. 1 is a schematic cross-sectional view illustrating a schematic structure of a semiconductor device according to a first embodiment of the present invention.

A semiconductor device of a solid-state imaging device according to a first embodiment of the present invention will be described in detail with reference to the drawings. FIG. 1 is a schematic cross-sectional view illustrating a schematic structure of a semiconductor device 100 according to the present embodiment. FIG. 1 shows a cross-sectional view of the semiconductor device 100 cut off along a plane perpendicular to the surface of a semiconductor substrate 10.

As shown in FIG. 1, the semiconductor device 100 includes the semiconductor substrate 10 having an integrated circuit 11 of a solid-state imaging element formed therein, a glass substrate 20 arranged at a light-receiving surface (hereinafter, referred to as the first surface) side of the solid-state imaging element of the integrated circuit 11 formed in the semiconductor substrate 10, and a cavity dam 30 which is a spacer for forming a predetermined space (cavity 32) between the semiconductor device 100 and the glass substrate 20. A solder ball is mounted as an external connection terminal 40 on the surface (hereinafter, referred to as the second surface) on the opposite side to the surface on which the integrated circuit 11 in the semiconductor substrate 10 is formed.

In the semiconductor substrate 10, for example, using a silicon (111) substrate as a semiconductor substrate 10A, the semiconductor substrate 10 is used in which the thickness of the semiconductor substrate 10A is reduced to equal to or less than 100 μm. The integrated circuit 11 formed on the first surface side of the semiconductor substrate 10 is the integrated circuit 11 in which a solid-state imaging element such as, for example, a CMOS (Complementary Metal Oxide Semiconductor) sensor, a CCD (Charge Coupled Device) sensor, or a photodiode is formed. An I/O pad 12 is formed on the first surface side of the semiconductor substrate 10 using a portion of patterns of wirings 12a in the integrated circuit 11 which are formed on an insulating layer 12b.

A two-stage through-hole 13 which penetrates from the second surface side to the first surface to reach the I/O pad 12 is formed in the semiconductor substrate 10. An insulating film 14 is formed on the sidewall of the two-stage through-hole 13, and a through-electrode 15 formed of a metal is formed on the wall surface of the insulating film 14. The through-electrode 15 electrically connects the I/O pad 12 and a wiring pattern 41 on the second surface of the semiconductor substrate 10. That is, in the through-electrode 15, the wiring of the semiconductor substrate 10 is extracted from the I/O pad 12 to the wiring pattern 41 on the second surface side.

Next, a solder resist 42 of an insulating resin for protecting the second surface side having the wiring pattern 41 of the semiconductor substrate 10 formed thereon is formed. The external connection terminal 40 is formed by forming a solder ball on the wiring pattern 41 exposed to an opening 43 of the solder resist 42.

The two-stage through-hole 13 of the semiconductor substrate 10 has a first hole (first shape portion) 13a which has a wide opening portion at the second surface side and of which the hole diameter becomes smaller in a tapered shape. The first hole 13a is tapered in shape, and thus has the effect of being capable of filling the entirety of the first hole 13a with the solder resist 42.

When the integrated circuit 11 is formed by, for example, a CMOS sensor or a photodiode, the integrated circuit 11 has a configuration in which a plurality of pixels of one solid-state imaging element constituted by a semiconductor element such as a CMOS sensor or a photodiode are arranged in a two-dimensional array on the first surface of the semiconductor substrate 10.

A color filter layer 50 including a RGB color filter corresponding to each pixel and a passivation layer is formed in a region in which pixels of the solid-state imaging element of the integrated circuit 11 formed on the first surface side of the semiconductor substrate 10 are formed.

A light-shielding film that covers a region in which the solid-state imaging element of the integrated circuit 11 in the first surface of the semiconductor substrate 10 is not formed can also be formed in the portion of the color filter layer 50. A condensing micro-lens array 51 can also be formed at a place corresponding to each solid-state imaging element of the integrated circuit 11, on the surface of the color filter layer 50.

Further, the cavity dam 30 serving as a spacer surrounding the peripheries of the color filter layer 50 and the micro-lens array 51 on the semiconductor substrate 10 is formed on the transparent glass substrate 20. In addition, the cavity dam 30 of the glass substrate 20 is bonded to the first surface of the semiconductor substrate 10. That is, the lower side of the micro-lens array 51 on the first surface of the semiconductor substrate 10 is covered with the transparent glass substrate 20, and the lateral side of the micro-lens array 51 is covered with the cavity dam 30. Thereby, the integrated circuit 11 of the semiconductor substrate 10, the color filter layer 50, and the cavity 32 in which all directions of the micro-lens array 51 are blocked by the glass substrate 20 and the cavity dam 30 are formed.

The I/O pad 12 is formed on the first surface side of the semiconductor substrate 10 using a portion of the wirings 12a of the integrated circuit 11. The wiring 12a of the integrated circuit 11 including a pattern of the I/O pad 12 can be formed of, for example, aluminum (Al) film. However, the wiring 12a of the integrated circuit 11 is not limited thereto, but various electric conductor films such as a copper (Cu) film, a titanium (Ti) film, other metal films, an alloy film, or a laminated film thereof can be used therefor.

Further, wirings are extracted by the through-electrode 15 from the I/O pad 12 formed by a portion of patterns of wirings 12a of the integrated circuit 11 formed on the first surface of the semiconductor substrate 10 to the second surface side of the semiconductor substrate 10. The wiring of the through-electrode 15 is connected to the wiring pattern 41 and the external connection terminal 40 which are formed on the second surface of the semiconductor substrate 10.

The through-electrode 15 is formed using the two-stage through-hole 13 (also referred to as a contact hole) which penetrates the semiconductor substrate 10 from the second surface side to reach the I/O pad 12 on the first surface. That is, the insulating film 14 is formed on the wall surface of the two-stage through-hole 13, and the through-electrode 15 is formed of a metal film on the insulating film 14.

The insulating film 14 formed on the wall surface within the two-stage through-hole 13 prevents the through-electrode 15 and the semiconductor substrate 10 from being directly in contact with each other. In addition, the insulating film 14 also extends onto the second surface of the semiconductor substrate 10, and has the wiring pattern 41 on the second surface side formed thereon, to thereby prevent the wiring pattern 41 and the semiconductor substrate 10 from being directly in contact with each other.

When the metal film of the through-electrode 15 is formed, a conductive layer of the wiring pattern 41 on the second surface is also formed together. In addition, the through-electrode 15 is electrically connected to the I/O pad 12 exposed to the bottom of the two-stage through-hole 13.

The through-electrode 15 and the wiring pattern 41 are formed of a conductive layer of the same metal. The conductive layer for forming the through-electrode 15 and the wiring pattern 41 can also be formed of, for example, an Al film, or, can also be formed of a Cu film using a laminated film of Ti and Cu as an underlying layer. The thickness of the conductive layer may be, for example, approximately 5 μm.

The insulating solder resist 42 is formed on the second surface side of the semiconductor substrate 10 having the wiring pattern 41 formed thereon. The solder resist 42 can be formed using, for example, a photosensitive epoxy-based insulating resin. The opening 43 in which a solder ball of the external connection terminal 40 is selectively mounted is formed in the solder resist 42. The external connection terminal 40 is formed in the opening 43 by self-aligning liquid solder to mount a solder ball.

The solder resist 42 protects the semiconductor substrate 10 from heat. In addition, the first hole 13a having a tapered shape opened to the second surface side of the two-stage through-hole 13 is filled with the solder resist 42. Thereby, the filling portion of the solder resist 42 serves as an anchor and thus the solder resist 42 can be tightly fixed to the second surface. Therefore, it is possible to increase the reliability of adhesion to the second surface of the solder resist 42.

(Manufacturing Method)

Next, a method for manufacturing the semiconductor device 100 according to the present embodiment will be described in detail with reference to the accompanying drawings.

FIGS. 2 to 13 are process diagrams illustrating a method for manufacturing the semiconductor device 100 according to the present embodiment. In the method for manufacturing the semiconductor device 100 according to the present embodiment, a so-called W-CSP (Wafer Level Chip Size Package) technique is used in which a plurality of semiconductor devices 100 are created with reference to one wafer. However, in the following, for the purpose of simplifying the description, attention is focused on one chip (semiconductor device 100).

(Process 1)

In the present embodiment, first, the integrated circuit 11 constituted by a large number of solid-state imaging elements is formed on the surface (first surface) of the semiconductor substrate 10A of a silicon wafer having a diameter of 20 cm, 30 cm, or other sizes. In addition, the I/O pad 12 is formed using a portion of patterns of the wirings 12a formed on the insulating layer 12b of the integrated circuit 11.

Figure 2:
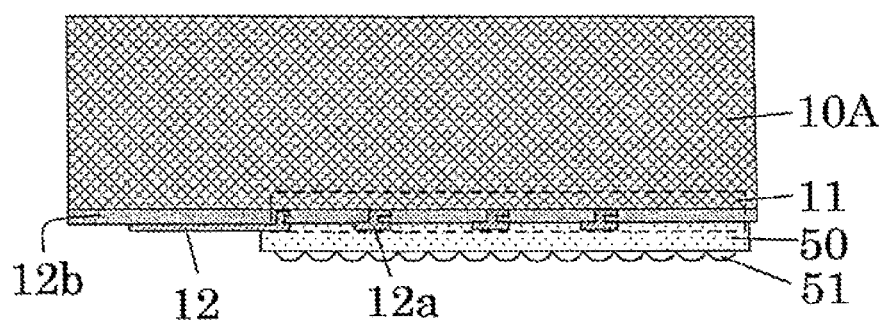
FIG. 2 is a process diagram (1) illustrating a method for manufacturing a semiconductor device according to the first embodiment of the present invention.

After the integrated circuit 11 is formed on the first surface side of the semiconductor substrate 10A in this manner, as shown in the cross-sectional view of FIG. 2, the color filter layer 50 for color separation and the condensing micro-lens array 51 are sequentially formed on the solid-state imaging element on the first surface in association with each pixel. The I/O pad 12 of a portion of the wirings 12a of the integrated circuit 11 on the first surface of the semiconductor substrate 10A in FIG. 2 is a basic conductor pattern for forming the through-electrode 15 on the I/O pad 12.

(Process 2)

Figure 3:
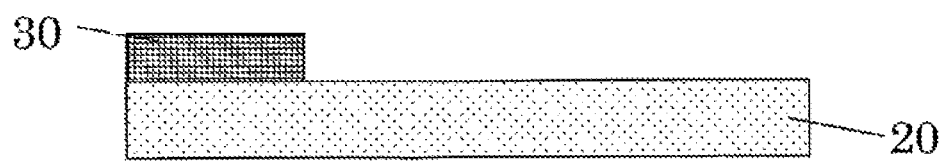
FIG. 3 is a process diagram (2) illustrating a method for manufacturing the semiconductor device according to the first embodiment of the present invention.

Next, as shown in FIG. 3, the cavity dam 30 serving as a spacer surrounding the peripheries of the color filter layer 50 and the micro-lens array 51 on the semiconductor substrate 10A is formed on the transparent glass substrate 20.

Materials of the cavity dam 30 to be used may include thermosetting polyimide, an epoxy resin, or an acrylic urethane-based photosensitive resin which is used as a resin film with high adhesion. The cavity dam 30 having a thickness of approximately 50 to 100 μm is formed on the glass substrate 20 by a photolithography method having an exposure and development process after a photosensitive resin is applied to the glass substrate 20, as shown in FIG. 3, with desired patterns located at positions surrounding the color filter and the micro-lens on the semiconductor substrate 10.

(Process 3)

Figure 4:
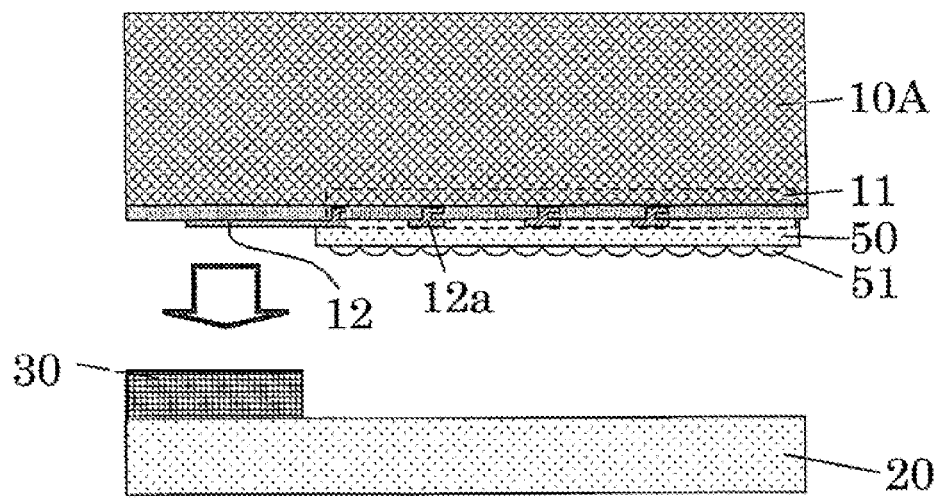
FIG. 4 is a process diagram (3) illustrating a method for manufacturing the semiconductor device according to the first embodiment of the present invention.
Figure 5:
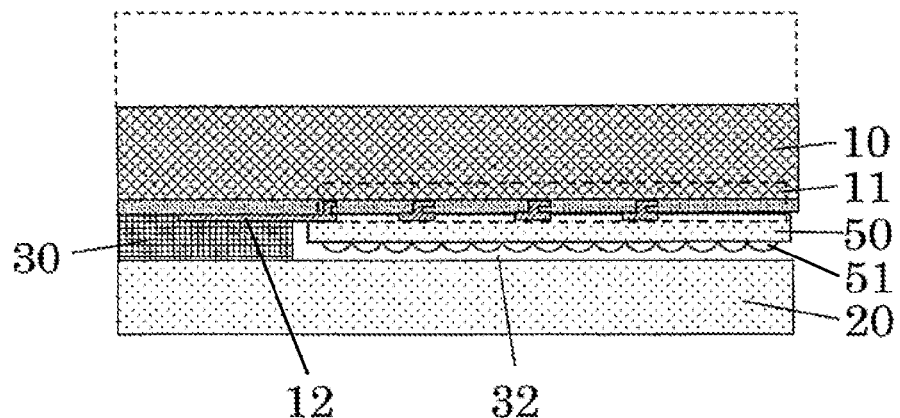
FIG. 5 is a process diagram (4) illustrating a method for manufacturing the semiconductor device according to the first embodiment of the present invention.

Subsequently, as shown in FIG. 4, the cavity dam 30 is bonded to the first surface of the semiconductor substrate 10, and the lower side of the micro-lens array 51 on the first surface of the semiconductor substrate 10 is covered with the transparent glass substrate 20. Thereby, as shown in FIG. 5, the cavity 32 is formed in which all directions are blocked by the semiconductor substrate 10, the glass substrate 20 and the cavity dam 30. Thereby, a void of the cavity 32 is secured between the glass substrate 20 and the micro-lens array 51, and thus the light-condensing effect of each micro-lens can be prevented from being damaged.

(Process 4)

Next, as shown in FIG. 5, the thickness of the semiconductor substrate 10A is reduced from the second surface side. This can be performed by combining, for example, grinding, CMP (chemical mechanical polishing), and wet etching as necessary. In addition, it is preferable that the film thickness of the semiconductor substrate 10 after a reduction in thickness be set to be approximately equal to or less than 50 to 100 μm. Thereby, a further reduction in size and a further reduction in thickness can be made while maintaining the rigidity of the semiconductor device 100.

(Formation of Through-electrode (TSV))

(Process 5)

Figure 6:
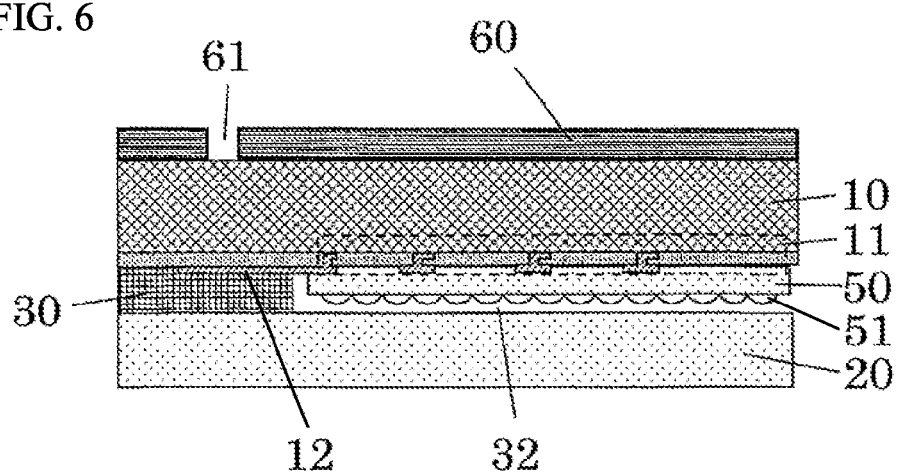
FIG. 6 is a process diagram (5) illustrating a method for manufacturing the semiconductor device according to the first embodiment of the present invention.

Next, as shown in FIG. 6, a photoresist 60 for dry-etching having a thickness of 10 μm is formed on the second surface of the semiconductor substrate 10 of which the thickness is reduced and has a thickness, of for example, 100 μm using photolithography. A novolac positive-type photosensitive photoresist 60 for dry-etching is applied to the surface of the semiconductor substrate 10 by a spin coater so as to have finally a thickness of 10 μm, and heated (130° C.) and dried by an oven. The photoresist 60 for dry-etching is exposed and developed by an exposure apparatus, and thus a pattern having an opening 61 with a diameter of 20 μm is formed in a region in which the two-stage through-hole 13 located at a position corresponding to the I/O pad 12 is formed.

(Process 6)

Thereafter, using a mixed gas of $O_2$ which contains $SF_6$ (sulfur hexafluoride) gas as a main component, the semiconductor substrate 10 is dry-etched by a dry-etching apparatus for five minutes in an RIE (Reactive Ion Etching) mode from the second surface side, using the photoresist 60 for dry-etching as a mask.

Figure 7:
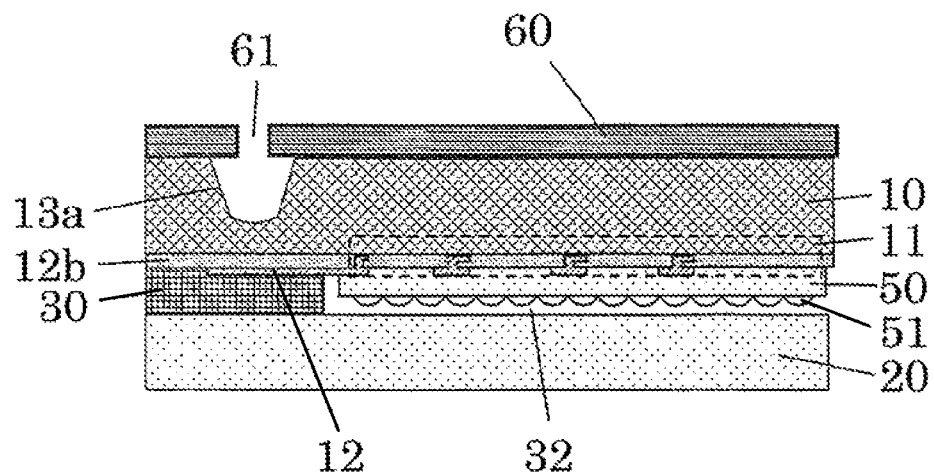
FIG. 7 is a process diagram (6) illustrating a method for manufacturing the semiconductor device according to the first embodiment of the present invention.

Thereby, as shown in FIG. 7, the first hole 13a having a depth of 50 μm is formed in the second surface side of the semiconductor substrate 10, the hole having an opening with a diameter of 50 μm which is larger than the diameter of the opening 61 under the opening 61 with a diameter of 20 μm of the photoresist 60 for dry-etching, and having a tapered shape with a smaller diameter toward the first surface side.

(Process 7)

Next, dry-etching of a Bosch mode is performed in which etching using $SF_6$ and the protective film formation of the sidewall using $C_4F_8$ (perfluorocyclobutane) are alternately performed. The dry-etching of a Bosch mode is performed until reaching the I/O pad 12 by alternately repeating an etching step of 6 seconds and a passivation step of 2 seconds of forming a protective film at a coil voltage of 2,500 W.

Figure 8:
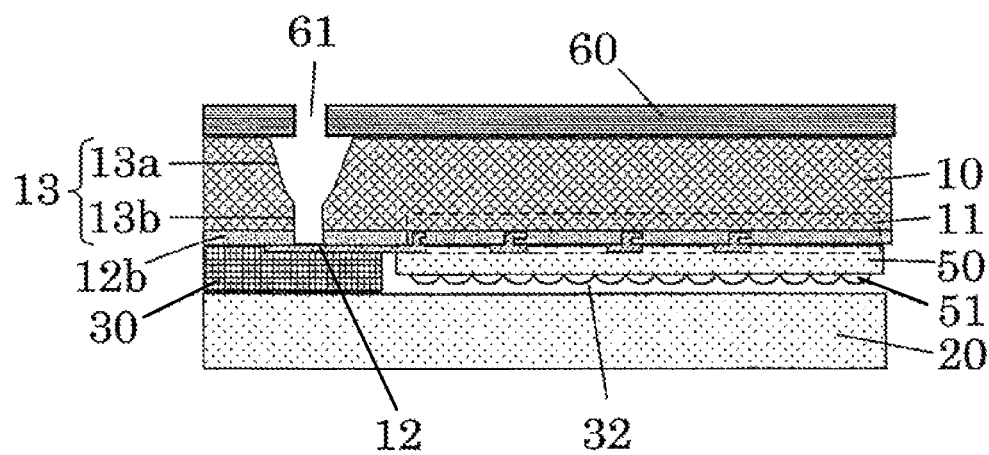
FIG. 8 is a process diagram (7) illustrating a method for manufacturing the semiconductor device according to the first embodiment of the present invention.

As shown in FIG. 8, a second hole (second shape portion) 13b, having a depth of 50 μm, extending from the bottom of the first hole 13a having a tapered shape which is formed in advance through the semiconductor substrate 10 and the insulating layer 12b to the I/O pad 12 on the first surface side is formed by the dry-etching of a Bosch mode. The second hole 13b is formed so as to have a perpendicular cylindrical wall surface with a diameter of 20 μm of the same size as the diameter of the opening 61 of the photoresist 60 for dry-etching.

As described above, the first hole 13a is first formed which has an opening diameter of 50 μm from the second surface side of the semiconductor substrate 10, and of which the diameter becomes smaller in a tapered shape from the second surface side to the first surface side. Further, the second hole 13b is formed which has a perpendicular cylindrical wall surface with a diameter of 20 μm extending from the bottom of the first hole 13a to the I/O pad 12. In this manner, the two-stage through-hole 13 is formed which is constituted by the first hole 13a and the second hole 13b passing through the semiconductor substrate 10 having a thickness of 100 μm to reach the I/O pad 12. As shown in FIG. 8, the cross-sectional shape of the two-stage through-hole 13 is formed to have a wine glass (or cocktail glass) shape.

The upper portion of the two-stage through-hole 13 is constituted by the first hole 13a of which the diameter becomes smaller in a tapered shape as the wall surface goes from the top to the bottom in a tapered shape. This tapered wall surface is suitable for a film forming process of an insulating film 14A in the two-stage through-hole 13 and a film forming process of the through-electrode 15 on the insulating film 14A.

In addition, the wall surface of the second hole 13b extending from the bottom of the first hole 13a of the two-stage through-hole 13 to the underlying I/O pad 12 has a perpendicular cylinder shape and is constant in hole diameter. Even when the thickness of the semiconductor substrate 10 changes, the opening diameter of a hole located below the two-stage through-hole 13 is the same as the hole diameter of the second hole 13b. Such a structure is suitable for a film forming process of the stable insulating film 14A in the wall surface extending from the bottom of the first hole 13a of the two-stage through-hole 13 to the I/O pad 12 and a film forming process of the through-electrode 15 on the insulating film 14A.

(Process 8)

Next, the photoresist 60 for dry-etching on the surface layer is peeled off by an ashing apparatus using $O_2$ gas.

(Process 9)

Figure 9:
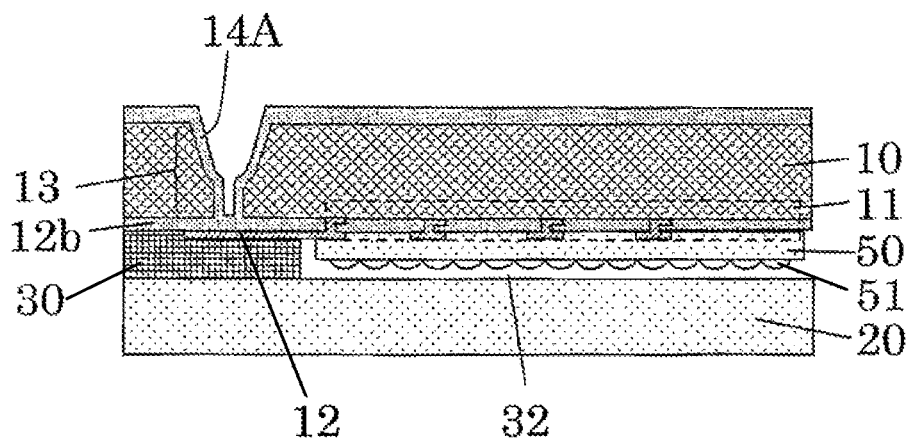
FIG. 9 is a process diagram (8) illustrating a method for manufacturing the semiconductor device according to the first embodiment of the present invention.

Next, as shown in FIG. 9, the insulating film 14A is formed on the second surface of the silicon semiconductor substrate 10 and the wall surface of the two-stage through-hole 13. The insulating film 14A is formed of an inorganic insulating film such as a silicon oxide film ($SiO_2$) or a silicon nitride film (SiN).

In order to form the inorganic insulating film 14A, the insulating film 14A can be formed using CVD (Chemical Vapor Deposition) or the like. For example, when the insulating film 14A of $SiO_2$ is formed by a chemical vapor deposition method using a plasma CVD apparatus, the insulating film 14A of $SiO_2$ can be formed using ethyl orthosilicate $Si(OC_2H_5)_4$, TEOS (Tetraethoxysilane) or the like as a material gas.

As the results of an experiment, when the insulating film 14A of inorganic $SiO_2$ is formed by a chemical vapor deposition method using a plasma CVD apparatus, the uniform insulating film 14A was formed up to the wall surface of the two-stage through-hole 13 and the bottom of the two-stage through-hole 13. The reason for being able to form a uniform high-quality film is that the two-stage through-hole 13 is a complex of the first hole 13a having a tapered shape and the second hole 13b having a perpendicular cylindrical wall surface.

Regarding the thickness in each portion of the insulating film 14A, the insulating film 14A of $SiO_2$ in the vicinity of the opening of the first hole 13a of the two-stage through-hole 13 had a film thickness of 1.5 µm. The insulating film 14A having a thickness of 0.6 µm was formed on the perpendicular cylindrical wall surface of the second hole 13b of the two-stage through-hole 13 which is not likely to form a film. In addition, the insulating film 14A having a thickness of 0.5 µm was formed on the I/O pad 12 located below the second hole 13b of the two-stage through-hole 13.

(Process 10)

Figure 10:
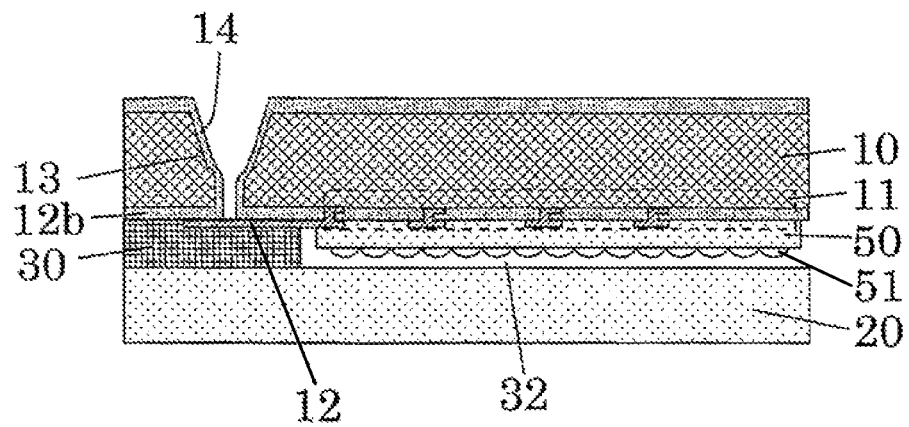
FIG. 10 is a process diagram (9) illustrating a method for manufacturing the semiconductor device according to the first embodiment of the present invention.

Next, as shown in FIG. 10, a resist mask is not used, and etching is performed over the entire surface of the semiconductor substrate 10 by a dry-etching apparatus for an oxide film, using a mixed gas of $C_4F_8$ gas which contains $SF_6$ gas as a main component. The etching is performed until the $SiO_2$ film of 0.5 µm located below the two-stage through-hole 13 is removed and the I/O pad 12 located below the hole is exposed.

According to this process, when the $SiO_2$ film of 0.5 µm located below the two-stage through-hole 13 was removed and the I/O pad 12 located below the hole was exposed, the insulating film 14 having a thickness of 0.5 µm was left on the perpendicular cylindrical wall surface of the second hole 13b of the two-stage through-hole 13. The insulating film 14 having a thickness of 0.7 µm was left in the vicinity of the opening of the first hole 13a of the two-stage through-hole 13, and the insulating film 14 having a thickness of 0.7 µm was also left on the upper surface of the semiconductor substrate 10.

That is, while the I/O pad 12 located below the two-stage through-hole 13 is exposed by an overall dry-etching process without using a resist mask, the insulating film 14 can be left on the sidewall of the two-stage through-hole 13, and the insulating film 14 can also be left on the second surface of the semiconductor substrate 10. In this manner, in the manufacturing method in which a resist mask is not used, the insulating film 14A is removed by dry-etching so as to expose only the I/O pad 12 located below the two-stage through-hole 13, and thus the insulating film 14 can be left on the wall surface of the two-stage through-hole 13 and the second surface of the semiconductor substrate 10 except for that.

In this manner, in the present embodiment, the two-stage through-hole 13 is formed of a complex of the first hole 13a having a tapered shape and the second hole 13b having a perpendicular cylindrical wall surface, and thus it is possible to form a structure obtained by exposing the I/O pad 12 located below the two-stage through-hole 13 from the insulating film 14 through a low-cost method using an overall etching process of the insulating film 14A in which a resist mask is not used.

The reason for being able to expose the I/O pad 12 located below of the two-stage through-hole 13 from the insulating film 14 through a low-cost method using an overall etching process of the insulating film 14A in which a resist mask is not used is because the first hole 13a having a tapered shape and the second hole having a perpendicular cylindrical shape which constitute the two-stage through-hole 13 have the following configurations.

The second hole 13b constituting the two-stage through-hole 13 has a perpendicular cylindrical shape with a diameter of approximately 20 µm. However, the depth thereof is equal to or less than four times the diameter (the depth of the second hole 13b is equal to or less than 70 µm when the diameter of the second hole 13b is 18 µm) and is relatively small. Therefore, when the insulating film 14A is formed by a chemical vapor deposition method in Process 9, the uniform insulating film 14A is formed on the wall surface of the second hole 13b, with a relative large thickness.

Next, in the present embodiment, when the diameter of the opening of the first hole 13a constituting the two-stage through-hole 13 is 50 µm, the depth thereof is 50 µm, and the diameter of the bottom is 30 µm, the tilt of the tapered wall surface (that is, tilt to the second surface when seen from the cross-section of the through-hole 13 or the first hole 13a) is arctan (50/10)=79 degrees. When the tilt of the tapered wall surface of the first hole 13a constituting the two-stage through-hole 13 is equal to or less than 80 degrees, a material gas in a chemical vapor deposition method for forming the insulating film 14A circulates freely without interfering with the inside of the first hole 13a, thereby allowing the gas to reach the second hole 13b.

In addition, it is preferable that in the cross-section of the first hole 13a, the tapered wall surface have a tilt to the second surface of equal to or greater than 60 degrees. When the first hole 13a is formed up to about half the depth of the thickness of the semiconductor substrate 10, the reason is because it is preferable that the diameter of the opening of the first hole be made to be smaller than (diameter of the bottom of the first hole 13a)+(half of the thickness of the semiconductor substrate 10), and that the diameter of the opening of the through-electrode 15 be made to be smaller than the thickness of the semiconductor substrate 10.

From the above reasons, it is preferable that in the cross-section of the through-hole 13 (or first hole 13a), the tapered wall surface have a tilt to the second surface which is equal to or greater than 60 degrees and equal to or less than 80 degrees (tilt to the axis of the through-hole 13 is equal to or greater than 10 degrees and equal to or less than 30 degrees). The tilt of the tapered wall surface can be controlled by adjusting process conditions of etching of the semiconductor substrate 10.

(Process 11)

Figure 11:
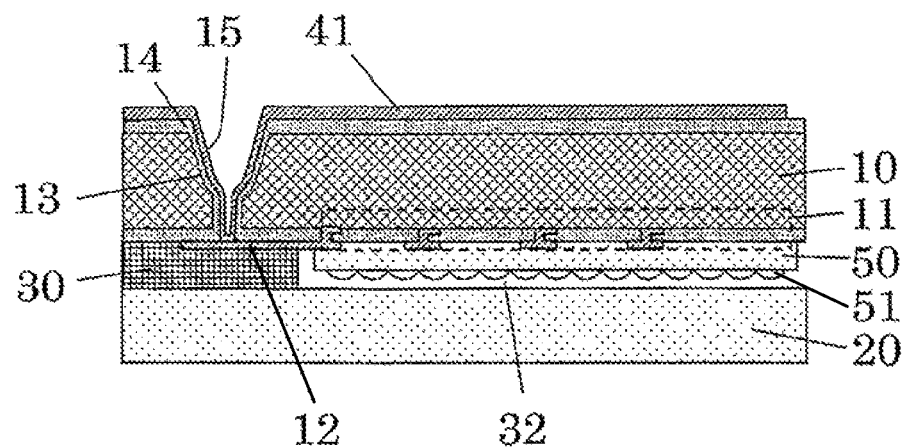
FIG. 11 is a process diagram (10) illustrating a method for manufacturing the semiconductor device according to the first embodiment of the present invention.

Next, using a sputtering apparatus, as shown in FIG. 11, a metal film of an Al layer is deposited on the second surface of the semiconductor substrate 10 and the inner wall and bottom of the two-stage through-hole 13, to form the through-electrode 15. The through-electrode 15 is a through-silicon via (TSV) for electrical conduction between the surface and the back surface of the semiconductor substrate 10 which is a silicon substrate.

As the results of the experiment, a metal film of an Al layer was formed uniformly up to the tapered wall surface of the first hole 13a located above the two-stage through-hole 13, the perpendicular cylindrical wall surface of the second hole 13b located below the two-stage through-hole 13, and the bottom of the two-stage through-hole 13, and thus the through-electrode 15 was able to be formed. In addition, the thickness of the Al layer in the vicinity of the opening located at the upper end of the two-stage through-hole 13 was 6 µm, and a metal layer of Al was able to be formed which has a thickness of 0.2 µm on the perpendicular cylindrical wall surface of the second hole 13b located below the two-stage through-hole 13 which is not most likely to allow attachment of a film, and has a thickness of 0.3 µm on the I/O pad 12 located below the two-stage through-hole 13.

In this manner, the two-stage through-hole 13 is formed of a complex of the first hole 13a having a tapered shape and the second hole 13b having a perpendicular cylindrical wall surface, thereby allowing the uniform high-quality through-electrode 15 to be formed on the inner wall surface of the two-stage through-hole 13 by a vacuum film formation method.

In addition, in the present embodiment, in order to form a metal layer, even when a vacuum film formation method of a CVD method is used without being limited to a sputtering method, the metal layer can be formed satisfactorily without the occurrence of a defect on the wall surface of the two-stage through-hole 13.

(Process 12)

Next, a photoresist is formed on a metal layer that covers the second surface side of the semiconductor substrate 10 by photolithography. The wiring pattern 41 is formed on the second surface of the semiconductor substrate 10 by etching and removing patterns other than the metal layer protected by this photoresist.

(Process 13)

Figure 12:
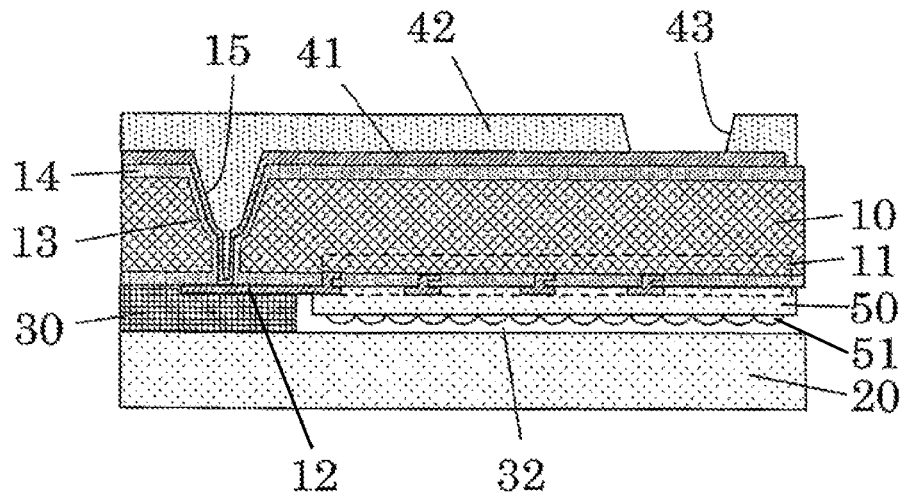
FIG. 12 is a process diagram (11) illustrating a method for manufacturing the semiconductor device according to the first embodiment of the present invention.

A solution of a solder resist is applied to the second surface side of the semiconductor substrate 10 on which the wiring pattern 41 is formed. The solder resist is dried, and is next patterned by a photolithography process and an etching process. Thereby, as shown in FIG. 12, the solder resist 42 having the opening 43 formed therein is formed in a place for mounting a solder ball of the external connection terminal 40.

The first hole 13a which has a wide opening portion and of which the hole diameter becomes smaller in a tapered shape is formed at the second surface side of the semiconductor substrate 10. Since the shape thereof is tapered, the entirety of the first hole 13a can be filled with the solder resist 42.

(Process 14)

Figure 13:
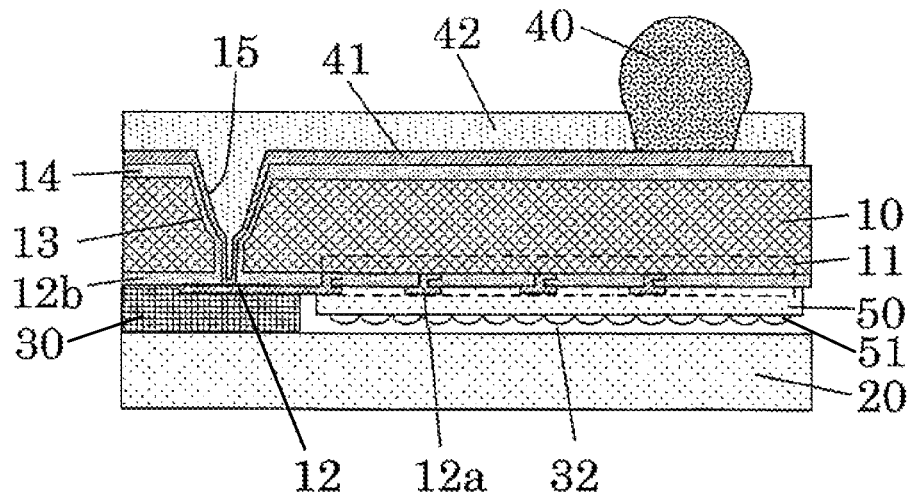
FIG. 13 is a process diagram (12) illustrating a method for manufacturing the semiconductor device according to the first embodiment of the present invention.

Next, using an existing ball mount apparatus, as shown in FIG. 13, a solder ball is mounted on a wiring pattern exposed to the opening 43 of the solder resist 42 to form the external connection terminal 40.

(Process 15)

Next, the semiconductor substrate 10 is diced along a scribe region using, for example, a diamond cutter or a laser beam. Thereby, the semiconductor device 100 formed in a two-dimensional array on the semiconductor substrate 10 of silicon is fragmented.

As described above, in the semiconductor device 100 according to the present embodiment, the two-stage through-hole 13 constituted by the first hole 13a having a tapered shape extending from the second surface to the I/O pad 12 on the first surface and the second hole 13b having a cylindrical wall surface is formed in the semiconductor substrate 10 having the integrated circuit 11 as a semiconductor element formed on the first surface. Thereby, the high-quality insulating film 14 and the high-quality through-electrode 15 (TSV) having a metal layer can be formed in the two-stage through-hole 13. Therefore, the semiconductor device 100 is obtained in which the wiring of the integrated circuit 11 and the wiring pattern 41 on the second surface side are electrically connected to each other through the high-quality through-electrode 15.

The first hole 13a and the second hole 13b may not necessarily be formed to have the same depth. The first hole 13a may be formed up to a predetermined position of the semiconductor substrate 10 in a thickness direction, and the second hole 13b may be formed thereunder.

<Second Embodiment>

A second embodiment is different from the first embodiment in that a semiconductor device except for a solid-state imaging device is manufactured. In addition, in the second embodiment, the through-electrode 15 (TSV) and wiring pattern 41 are formed in a metal layer using copper.

(Manufacturing Method)

Hereinafter, a method for manufacturing a semiconductor device according to the second embodiment will be described in the accompanying drawings.

(Process 1)

Figure 14:
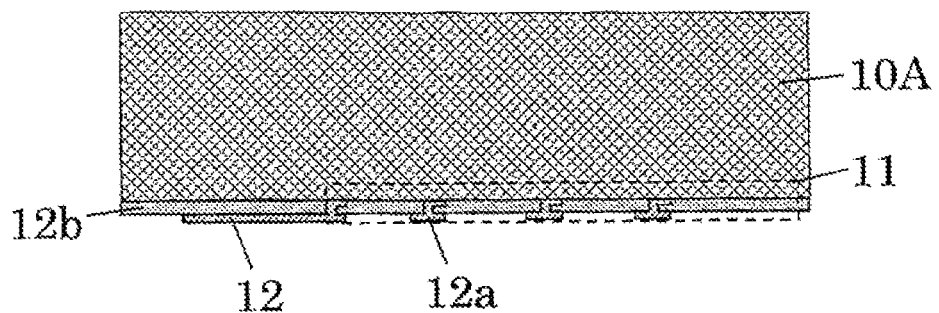
FIG. 14 is a process diagram (1) illustrating a method for manufacturing a semiconductor device according to a second embodiment of the present invention.

In the present embodiment, as shown in the cross-sectional view of FIG. 14, the integrated circuit 11 is formed on the surface of the semiconductor substrate 10A of a silicon wafer, and the I/O pad 12 is formed using a portion of the wirings 12a formed on the insulating layer 12b of the integrated circuit 11.

(Process 2)

Figure 15:
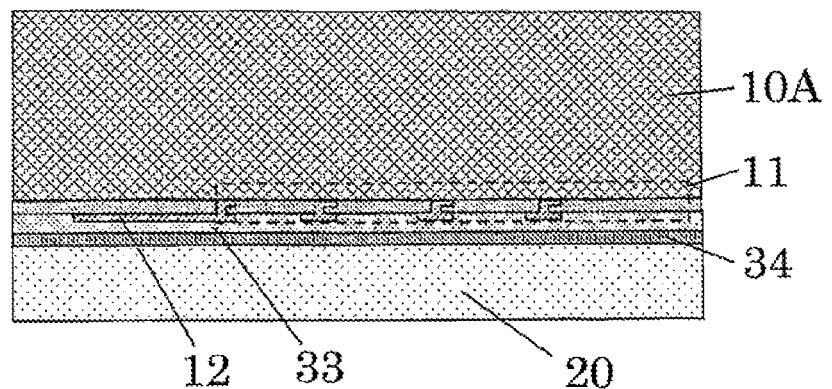
FIG. 15 is a process diagram (2) illustrating a method for manufacturing the semiconductor device according to the second embodiment of the present invention.

Next, as shown in FIG. 15, a support substrate 12 is attached to the semiconductor substrate 10A to form an integral structure. Thereby, it is possible to improve the accuracy and yield rate of processing of forming a structure in which the rigidity of the integral structure is increased, the semiconductor substrate 10A is easily handled, and the thickness of the semiconductor substrate 10A is reduced to approximately 10 µm to 50 µm.

That is, as shown in FIG. 15, a passivation film 33 such as a silicon nitride film is first formed which covers the integrated circuit 11 and the I/O pad 12 on the surface of the semiconductor substrate 10A of silicon. Further, an adhesive layer 34 is applied onto the passivation film 33, and the support substrate 12 is bonded to the semiconductor substrate 10A through the adhesive layer 34. The support substrate 12 can employ a wafer such as quartz, glass, or silicon.

The adhesive layer 34 also has a function of protecting an element surface electrode 4, a semiconductor element, and an interlayer insulating film. After the back surface of the semiconductor substrate 10 reduced in thickness is processed, the adhesive layer 34 uses a peelable material capable of stripping the semiconductor substrate 10 and the support substrate 12. That is, the adhesive layer 34 uses, for example, a thermoplastic adhesive. The thermoplastic adhesive can be softened by heating to perform bonding or stripping.

In addition, a transparent material such as quartz or glass is used in the support substrate 12, and an ultraviolet curing resin is used in the adhesive layer 34, thereby allowing the support substrate 12 to be bonded to the semiconductor substrate 10. In this case, in a method of peeling off the semiconductor substrate 10 from the support substrate 12, the semiconductor substrate can be stripped by local heating of a bonded surface using a laser or overall heating.

(Process 3)

Figure 16:
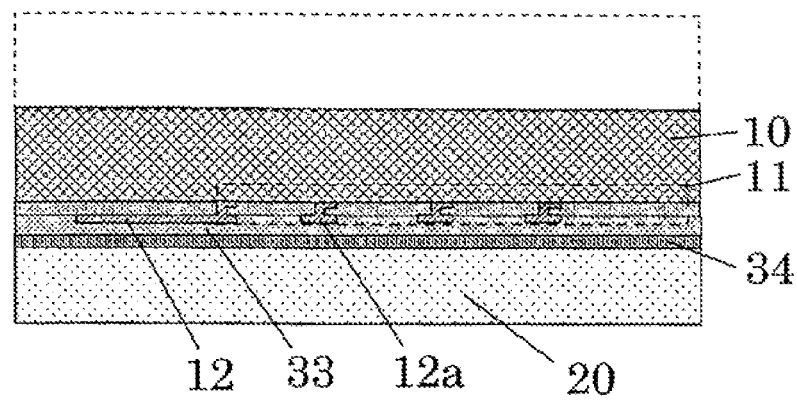
FIG. 16 is a process diagram (3) illustrating a method for manufacturing the semiconductor device according to the second embodiment of the present invention.

Next, as shown in FIG. 16, the back surface of the semiconductor substrate 10A is cut off to thereby reduce the thickness thereof. A method of cutting off the back surface of the semiconductor substrate 10A includes grinding, polishing or the like, but it is particularly preferable to perform dry polishing, etching, or CMP (chemical mechanical polishing). The semiconductor substrate 10 is formed to have a thickness equal to or less than 100 µm, preferably equal to or less than 50 µm by cutting off the back surface. In addition, in order to reduce the thickness of the semiconductor device having a large number of semiconductor substrates 10 laminated therein, it is preferable that the thickness of the semiconductor substrate 10 be equal to or less than 30 µm.

(Formation of Through-Electrode (TSV))

Next, the through-electrode (TSV) 15 and the wiring pattern 41 in which copper is used in a metal layer are formed by the following processes 4 to 11.

(Process 4)

Figure 17:
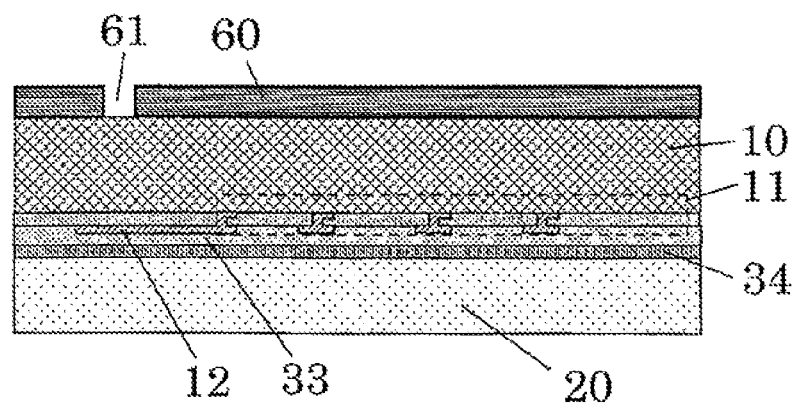
FIG. 17 is a process diagram (4) illustrating a method for manufacturing the semiconductor device according to the second embodiment of the present invention.

Next, as shown in FIG. 17, a photoresist 60 for dry-etching having a thickness of 10 µm is formed by photolithography on the second surface of the semiconductor substrate 10, having a thickness of, for example, 100 µm, of which the thickness is reduced. The photoresist 60 for dry-etching is exposed and developed by an exposure apparatus, and thus a pattern having an opening 61 with a diameter of 20 µm is formed in a region in which the two-stage through-hole 13 located at a position corresponding to the I/O pad 12 is formed.

(Process 5)

Thereafter, using a mixed gas of $O_2$ which contains $SF_6$ (sulfur hexafluoride) gas as a main component, the semiconductor substrate 10 is dry-etched by a dry-etching apparatus for five minutes in an RIE mode from the second surface side, using the photoresist 60 for dry-etching as a mask.

Figure 18:
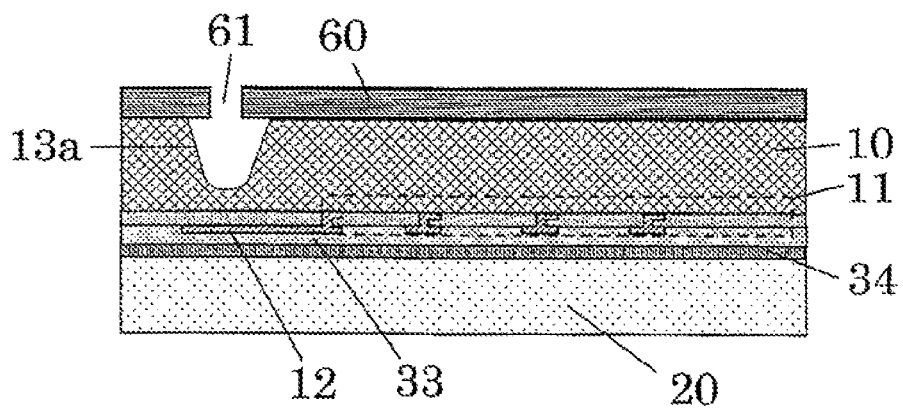
FIG. 18 is a process diagram (5) illustrating a method for manufacturing the semiconductor device according to the second embodiment of the present invention.

Thereby, as shown in FIG. 18, the first hole 13a having a depth of 50 µm is formed in the second surface side of the semiconductor substrate 10, the hole having an opening with a diameter of 50 µm which is larger than the diameter of the opening 61 under the opening 61 with a diameter of 20 µm of the photoresist 60 for dry-etching, and having a tapered shape with a smaller diameter toward the first surface side.

(Process 6)

Figure 19:
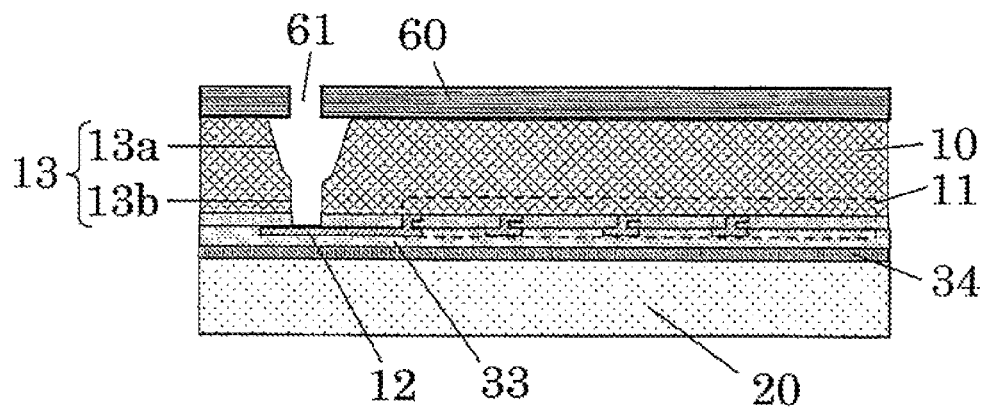
FIG. 19 is a process diagram (6) illustrating a method for manufacturing the semiconductor device according to the second embodiment of the present invention.

Next, dry-etching of a Bosch mode is performed in which etching using $SF_6$ and the protective film formation of the sidewall using $C_4F_8$ (perfluorocyclobutane) are alternately performed. As shown in FIG. 19, a second hole 13b, having a depth of 50 µm, extending from the bottom of the first hole 13a having a tapered shape which is formed in advance through the semiconductor substrate 10 of silicon and the insulating layer 12b to the I/O pad 12 located below the insulating layer 12b of the semiconductor substrate 10 is formed by the dry-etching of a Bosch mode. The second hole 13b is formed so as to have a perpendicular cylindrical wall surface with a diameter of 20 µm of the same size as the diameter of the opening 61 of the photoresist 60 for dry-etching.

As described above, the first hole 13a is first formed which has an opening diameter of 50 µm from the second surface side of the semiconductor substrate 10, and of which the diameter becomes smaller in a tapered shape from the second surface side to the first surface side. Further, the second hole 13b is formed which has a perpendicular cylindrical wall surface with a diameter of 20 µm extending from the bottom of the first hole 13a to the I/O pad 12. In this manner, the two-stage through-hole 13 is formed which is constituted by the first hole 13a and the second hole 13b passing through the semiconductor substrate 10 having a thickness of 100 µm to reach the I/O pad 12. As shown in FIG. 8, the cross-sectional shape of the two-stage through-hole 13 is formed to have a wine glass (or cocktail glass) shape.

In the present embodiment, as is the case with the first embodiment, the upper portion of the two-stage through-hole 13 is constituted by the first hole 13a of which the diameter becomes smaller in a tapered shape as the wall surface goes from the top to the bottom in a tapered shape. This tapered wall surface is suitable for a film forming process of an insulating film 14A in the two-stage through-hole 13 and a film forming process of the through-electrode 15 on the insulating film 14A.

In addition, the wall surface of the second hole 13b extending from the bottom of the first hole 13a of the two-stage through-hole 13 to the underlying I/O pad 12 has a perpendicular cylinder shape and is constant in hole diameter. Even when the thickness of the semiconductor substrate 10 changes, the opening diameter of a hole located below the two-stage through-hole 13 is the same as the hole diameter of the second hole 13b. Such a structure is suitable for a film forming process of the stable insulating film 14A in the wall surface of the second hole 13b extending from the bottom of the first hole 13a of the two-stage through-hole 13 to the I/O pad 12 and a film forming process of the through-electrode 15 on the insulating film 14A.

(Process 7)

Next, the photoresist 60 for dry-etching on the surface layer is peeled off by an ashing apparatus using $O_2$ gas.

(Process 8)

Figure 20:
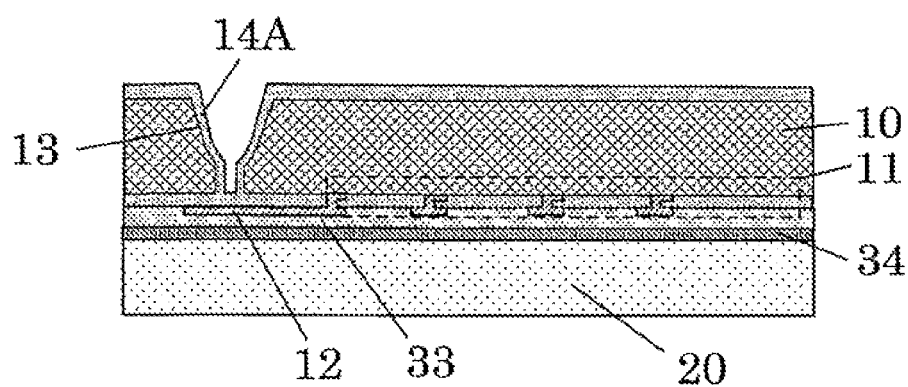
FIG. 20 is a process diagram (7) illustrating a method for manufacturing the semiconductor device according to the second embodiment of the present invention.

As shown in FIG. 20, the insulating film 14A is formed on the second surface of the silicon semiconductor substrate 10 and the wall surface of the two-stage through-hole 13. The insulating film 14A is formed of an inorganic insulating film such as a silicon oxide film ($SiO_2$) or a silicon nitride film (SiN).

In order to form the inorganic insulating film 14A, the insulating film 14A is formed using CVD or the like.

When the insulating film 14A of inorganic $SiO_2$ is formed by a chemical vapor deposition method using a plasma CVD apparatus, the uniform insulating film 14A is formed up to the wall surface of the two-stage through-hole 13 and the bottom of the two-stage through-hole 13. The reason for being able to form a uniform high-quality film is that the two-stage through-hole 13 is a complex of the first hole 13a having a tapered shape and the second hole 13b having a perpendicular cylindrical wall surface.

The thickness of the insulating film 14A of $SiO_2$ was 1.5 µm in the vicinity of the opening of the first hole 13a of the two-stage through-hole 13, and was 0.6 µm in the perpendicular cylindrical wall surface of the second hole 13b of the two-stage through-hole 13. The insulating film 14A having a thickness of 0.5 µm was formed on the I/O pad 12 located below the second hole 13b of the two-stage through-hole 13.

(Process 9)

Figure 21:
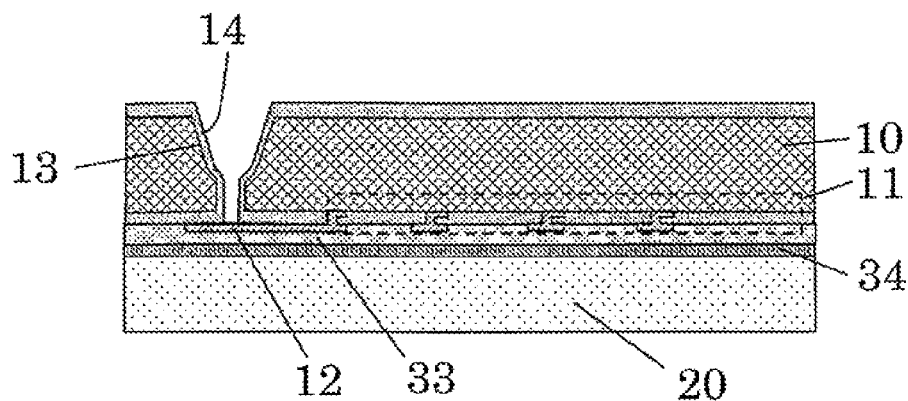
FIG. 21 is a process diagram (8) illustrating a method for manufacturing the semiconductor device according to the second embodiment of the present invention.

Next, a resist mask is not used, and etching is performed over the entire surface of the semiconductor substrate 10 by an oxide film etching apparatus, using a mixed gas of $C_4F_8$ gas which contains $SF_6$ gas as a main component. As shown in FIG. 21, the etching is performed until the $SiO_2$ film of 0.5 µm located below the two-stage through-hole 13 is removed and the I/O pad 12 is exposed to the hole bottom. Thereby, a film thickness of 0.5 µm is left on the perpendicular cylindrical wall surface of the second hole 13b of the two-stage through-hole 13. A film thickness left in the vicinity of the opening of the first hole 13a of the two-stage through-hole 13 may be 0.7 µm, and a film thickness left on the upper surface of the semiconductor substrate 10 may also be 0.7 µm.

That is, while the I/O pad 12 located below the two-stage through-hole 13 is exposed by an overall etching process without using a resist mask, the insulating film 14 can be left on the sidewall of the two-stage through-hole 13, and the insulating film 14 can also be left on the second surface of the semiconductor substrate 10. In this manner, in the manufacturing method in which a resist mask is not used, the insulating film 14A is removed by etching so as to expose only the I/O pad 12 located below the two-stage through-hole 13, and thus the insulating film 14 can be left on the wall surface of the two-stage through-hole 13 and the second surface of the semiconductor substrate 10 except for that.

(Process 10)

Figure 22:
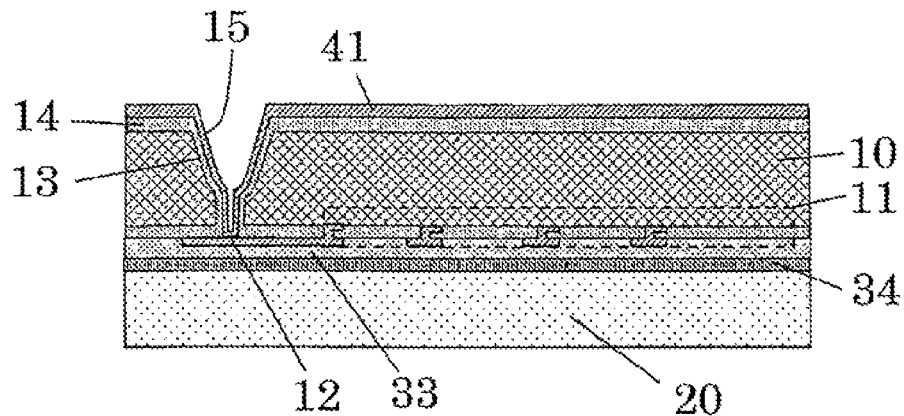
FIG. 22 is a process diagram (9) illustrating a method for manufacturing the semiconductor device according to the second embodiment of the present invention.

Using a sputtering apparatus, as shown in FIG. 22, a diffusion prevention layer such as titanium nitride (TiN) or tantalum nitride (TaN) is formed on the second surface of the semiconductor substrate 10 and the inner wall of the two-stage through-hole 13. Alternatively, the diffusion prevention layer may be formed by a CVD method.

(Process 11)

Next, a seed layer of copper is formed by a sputtering method, and copper is formed with a large thickness by an electroless plating method to form a conductive layer. The formation of the seed layer of copper may be performed by electroless copper plating instead of the sputtering method. The through-electrode 15 in which copper is used as a metal layer is formed through such a process. The through-electrode 15 is a through-silicon via (TSV) for electrical conduction between the surface and the back surface of the semiconductor substrate 10 of silicon.

In this manner, the diffusion prevention layer is formed on the inner wall surface of the two-stage through-hole 13 by a vacuum film formation method, and the metal layer of copper is formed, thereby allowing the uniform high-quality through-electrode 15 to be formed. Thereby, film formation can be performed without the occurrence of a defect up to the bottom of the two-stage through-hole 13.

(Process 12)

Figure 23:
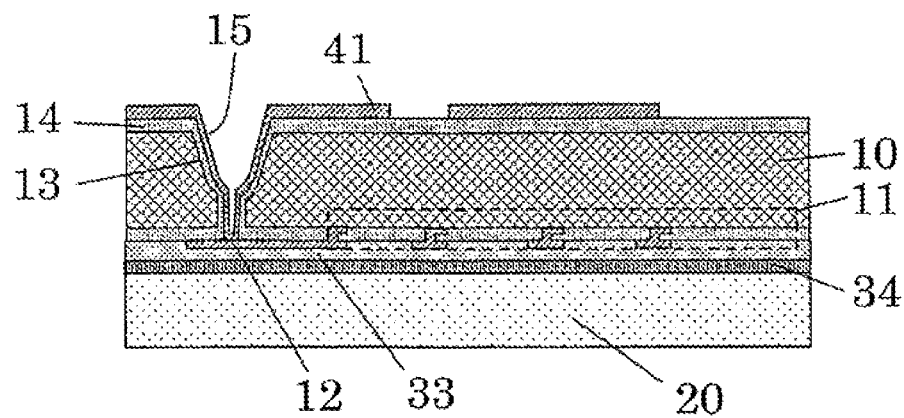
FIG. 23 is a process diagram (10) illustrating a method for manufacturing the semiconductor device according to the second embodiment of the present invention.

A photoresist is formed on a metal layer that covers the second surface side of the semiconductor substrate 10 by photolithography. As shown in FIG. 23, the wiring pattern 41 is formed on the second surface of the semiconductor substrate 10 by etching and removing patterns other than the metal layer protected by the photoresist.

(Process 13)

Figure 24:
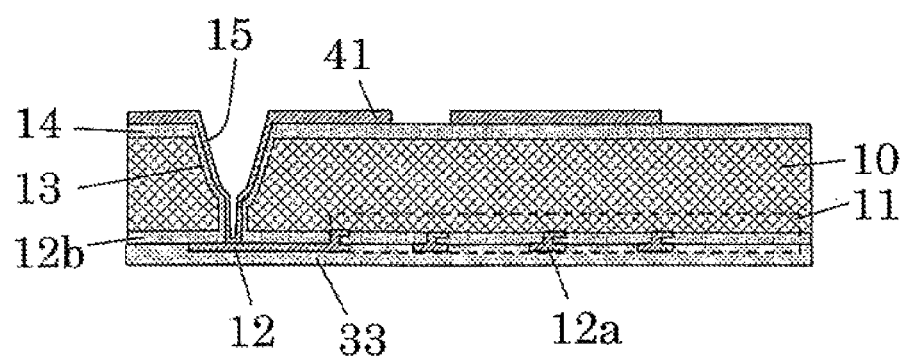
FIG. 24 is a process diagram (11) illustrating a method for manufacturing the semiconductor device according to the second embodiment of the present invention.

As shown in FIG. 24, the semiconductor substrate 10 is stripped from the support substrate 12. That is, when a thermoplastic adhesive is used in the adhesive layer 34, the thermoplastic adhesive is softened by heating, and the semiconductor substrate 10 is stripped from the support substrate 12. In addition, when bonding is performed using the adhesive layer 34 of an ultraviolet curing resin, the semiconductor substrate 10 is stripped from the support substrate 12 by local heating of a bonded surface using a laser or overall heating.

EXAMPLES

Hereinafter, examples of forming the two-stage through-hole 13 will be described.

Example 1

First, the semiconductor substrate 10, having a thickness of 80 μm, of which the thickness was reduced, was formed, as shown in FIG. 17, by processes 1 to 3 according to the second embodiment.

(Process 1)

The photoresist 60 for dry-etching having a thickness of 10 μm was formed by photolithography on the second surface of the semiconductor substrate 10 having a thickness of 80 μm. The photoresist 60 for dry-etching was formed as a pattern having an opening 61 having a diameter of 20 μm, in a region in which the two-stage through-hole 13 located at a position corresponding to the I/O pad 12 is formed.

(Process 2)

Thereafter, using a dry-etching apparatus, dry-etching was performed for six minutes in an RIE (Reactive Ion Etching) mode from the second surface side of the semiconductor substrate 10 having a thickness of 80 μm, using the photoresist 60 for dry-etching having the opening 61 as a mask. In the RIE mode, the flow rate of $SF_6$ (sulfur hexafluoride) gas was set to 100 sccm, the flow rate of $O_2$ gas was set to 250 sccm, and a coil voltage was set to 2,600 W.

Thereby, as shown in FIG. 18, the first hole 13a having a depth of 45 μm was formed in the second surface side of the semiconductor substrate 10, the hole having an opening with a diameter of 60 μm which is larger than the diameter of the opening 61 under the opening 61 with a diameter of 20 μm of the photoresist 60 for dry-etching, and having a tapered shape with a smaller diameter toward the first surface side.

(Process 3)

Next, in a dry-etching apparatus, an etching step of 2.5 seconds was performed at a coil voltage of 2,000 W in a state where the flow rate of $SF_6$ gas is set to 250 sccm. Next, a passivation step of forming a protective film on the sidewall for one second at a coil voltage of 2,000 W in a state where the flow rate of $C_4F_8$ (perfluorocyclobutane) is set to 250 sccm was performed, and a cycle of alternately performing both steps was repeated. The cycle of dry-etching of the Bosch mode was performed 70 times for four minutes and five seconds.

Thereby, as shown in FIG. 19, the second hole 13b, having a depth of 35 μm, extending from the bottom of the first hole 13a having a tapered shape which is formed in advance to the I/O pad 12 on the first surface side of the semiconductor substrate 10 was formed. The second hole 13b was formed so as to have a perpendicular cylindrical wall surface with a diameter of 20 μm of the same size as the diameter of the opening 61 of the photoresist 60 for dry-etching.

As described above, the first hole 13a having a depth of 45 μm was formed which has an opening diameter of 60 μm from the second surface side of the semiconductor substrate 10, and of which the diameter becomes smaller in a tapered shape from the second surface side to the first surface side. In addition, the second hole 13b having a perpendicular cylindrical wall surface was formed with a depth of 35 μm extending from the bottom of the first hole 13a to the I/O pad 12, and with a diameter of 20 μm.

In this manner, the two-stage through-hole 13 was formed which is constituted by the first hole 13a and the second hole 13b passing through the semiconductor substrate 10 having a thickness of 80 μm to reach the I/O pad 12. As shown in FIG. 19, the cross-sectional shape of the two-stage through-hole 13 was formed to have a wine glass (or cocktail glass) shape.

(Process 4)

Next, the photoresist 60 for dry-etching on the surface layer was peeled off by an ashing apparatus using $O_2$ gas.

(Process 5)

As shown in FIG. 20, the insulating film 14A of inorganic $SiO_2$ was formed on the second surface of the semiconductor substrate 10 and the wall surface of the two-stage through-hole 13, using a plasma CVD apparatus, by a chemical vapor deposition method in which TEOS (Tetraethoxysilane) is used in a material gas.

As a result, the uniform insulating film 14A of $SiO_2$ was formed up to the wall surface of the two-stage through-hole 13 and the bottom of the two-stage through-hole 13. The thickness of the insulating film 14A was 1.5 μm in the vicinity of the opening of the first hole 13a of the two-stage through-hole 13, and was 0.6 μm in the perpendicular cylindrical wall surface of the second hole 13b of the two-stage through-hole 13. The insulating film 14A having a thickness of 0.5 μm was formed on the I/O pad 12 located below the second hole 13b of the two-stage through-hole 13.

(Process 6)

As shown in FIG. 21, a resist mask was not used, and etching was performed over the entire surface of the semiconductor substrate 10 by a dry-etching apparatus for an oxide film, using a mixed gas of $C_4F_8$ gas which contains $SF_6$ gas as a main component. The etching was performed until the $SiO_2$ film of 0.5 μm located below the two-stage through-hole 13 was removed and the I/O pad 12 located below the hole was exposed.

As a result, the insulating film 14 having a thickness of 0.5 μm was left on the perpendicular cylindrical wall surface of the second hole 13b of the two-stage through-hole 13, the insulating film 14 having a thickness of 0.7 μm was left in the vicinity of the opening of the first hole 13a of the two-stage through-hole 13, and the insulating film 14 having a thickness of 0.7 μm was also left on the upper surface of the semiconductor substrate 10.

That is, while the I/O pad 12 located below the two-stage through-hole 13 was exposed by an overall etching process without using a resist mask, the insulating film 14 was able to be left on the sidewall of the two-stage through-hole 13, and the insulating film 14 could also be left on the second surface of the semiconductor substrate 10. In this manner, in the manufacturing method in which a resist mask is not used, the insulating film 14A was removed by etching so as to expose only the I/O pad 12 located below the two-stage through-hole 13, and thus the insulating film 14 was able to be left on the wall surface of the two-stage through-hole 13 and the second surface of the semiconductor substrate 10 except for that.

(Process 7)

Using a sputtering apparatus, as shown in FIG. 22, a metal film of an Al layer was deposited on the second surface of the semiconductor substrate 10 and the inner wall and bottom of the two-stage through-hole 13, to form the through-electrode (TSV) 15.

As a result, the metal film of an Al layer was formed uniformly up to the tapered wall surface of the first hole 13a located above the two-stage through-hole 13, the perpendicular cylindrical wall surface of the second hole 13b located below the two-stage through-hole 13, and the bottom of the two-stage through-hole 13, and thus the through-electrode 15 was able to be formed. In addition, the thickness of each portion of the metal film of an Al layer was 6 μm in the vicinity of the opening of the first hole 13a located at the upper end of the two-stage through-hole 13, was 0.2 μm on the perpendicular cylindrical wall surface of the second hole 13b located below the two-stage through-hole 13, and was 0.3 μm on the I/O pad 12 located below the two-stage through-hole 13.

Example 2

The semiconductor substrate 10, having a thickness of 90 μm, of which the thickness is reduced was formed, as shown in FIG. 17, by processes 1 to 3 according to the second embodiment.

(Process 1)

The photoresist 60 for dry-etching having a thickness of 10 μm was formed by photolithography on the second surface of the semiconductor substrate 10, having a thickness of 90 μm, of which the thickness is reduced. The photoresist 60 for dry-etching was formed in a pattern having an opening 61 having a diameter of 20 μm, in a region in which the two-stage through-hole 13 located at a position corresponding to the I/O pad 12 is formed.

(Process 2)

Thereafter, similarly to Example 1, dry-etching was performed in an RIE mode from the second surface side of the semiconductor substrate 10 having a thickness of 90 μm, using the photoresist 60 for dry-etching having the opening 61 as a mask. Further, as shown in FIG. 18, the first hole 13a having a depth of 45 μm was formed on the second surface side on the semiconductor substrate 10 in a tapered shape having an opening with a diameter of 60 μm.

(Process 3)

In a dry-etching apparatus, an etching step of 2.5 seconds was performed at a coil voltage of 2,000 W in a state where the flow rate of $SF_6$ gas is set to 250 sccm. Next, a passivation step of forming a protective film on the sidewall for one second at a coil voltage of 2,000 W in a state where the flow rate of $C_4F_8$ (perfluorocyclobutane) is set to 250 sccm was performed, and a cycle of alternately performing both steps was repeated. The cycle of dry-etching of the Bosch mode was performed 90 times for five minutes and fifteen seconds.

Thereby, as shown in FIG. 19, the second hole 13b, having a depth of 45 μm, extending from the bottom of the first hole 13a having a tapered shape which is formed in advance to the I/O pad 12 on the first surface side of the semiconductor substrate 10 was formed. The second hole 13b was formed so as to have a perpendicular cylindrical wall surface with a diameter of 20 μm of the same size as the diameter of the opening 61 of the photoresist 60 for dry-etching.

As described above, the first hole 13a having a depth of 45 μm was formed which has an opening diameter of 60 μm from the second surface side of the semiconductor substrate 10, and of which the diameter becomes smaller in a tapered shape from the second surface side to the first surface side. In addition, the second hole 13b having a perpendicular cylindrical wall surface was formed with a depth of 45 μm extending from the bottom of the first hole 13a to the I/O pad 12, and with a diameter of 20 μm. In this manner, the two-stage through-hole 13 was formed which is constituted by the first hole 13a and the second hole 13b passing through the semiconductor substrate 10 having a thickness of 90 μm to reach the I/O pad 12. As shown in FIG. 19, the cross-sectional shape of the two-stage through-hole 13 was formed to have a wine glass (or cocktail glass) shape.

(Process 4)

Next, similarly to Example 1, the photoresist 60 for dry-etching on the surface layer was peeled off by an ashing apparatus using $O_2$ gas.

(Process 5)

Similarly to Example 1, as shown in FIG. 20, the insulating film 14A of inorganic $SiO_2$ was formed on the second surface of the semiconductor substrate 10 and the wall surface of the two-stage through-hole 13, by a chemical vapor deposition method.

As a result, the uniform insulating film 14A of $SiO_2$ was formed up to the wall surface of the two-stage through-hole 13 and the bottom of the two-stage through-hole 13. The thickness of the insulating film 14A was 1.5 μm in the vicinity of the opening of the first hole 13a of the two-stage through-hole 13, and was 0.6 μm in the perpendicular cylindrical wall surface of the second hole 13b of the two-stage through-hole 13. The insulating film 14A having a thickness of 0.5 μm was formed on the I/O pad 12 located below the second hole 13b of the two-stage through-hole 13.

(Process 6)

Next, similarly to Example 1, as shown in FIG. 21, a resist mask was not used, and etching was performed over the entire surface of the semiconductor substrate 10 by a dry-etching apparatus for an oxide film, using a mixed gas of $C_4F_8$ gas which contains $SF_6$ gas as a main component. The etching was performed until the $SiO_2$ film of 0.5 μm located below the two-stage through-hole 13 was removed and the I/O pad 12 located below the hole was exposed.

As a result, the insulating film 14 having a thickness of 0.5 µm was left on the perpendicular cylindrical wall surface of the second hole 13b of the two-stage through-hole 13, the insulating film 14 having a thickness of 0.7 µm was left in the vicinity of the opening of the first hole 13a of the two-stage through-hole 13, and the insulating film 14 having a thickness of 0.7 µm was also left on the upper surface of the semiconductor substrate 10.

(Process 7)

Using a sputtering apparatus, as shown in FIG. 22, a diffusion prevention layer of titanium nitride (TiN) was formed on the second surface of the semiconductor substrate 10 and the inner wall of the two-stage through-hole 13.

(Process 8)

A seed layer of copper was formed by a sputtering method.

(Process 9)

Copper was formed with a large thickness by an electroless plating method to form a conductive layer, and thus the through-electrode (TSV) 15 was formed.

As a result, a metal film of a copper layer was formed uniformly up to the tapered wall surface of the first hole 13a located above the two-stage through-hole 13, the perpendicular cylindrical wall surface of the second hole 13b located below the two-stage through-hole 13, and the bottom of the two-stage through-hole 13, and thus the through-electrode 15 was able to be formed.

The present invention is not limited to the configurations described in the examples and embodiments above. For example, in the embodiment, when the two-stage through-hole 13 was formed, the first hole 13a having a tapered shape was formed by performing etching in an RIE mode from the second surface side of the semiconductor substrate 10, and the second hole 13b having a perpendicular cylindrical wall surface in a Bosch mode from the bottom of the first hole 13a was next formed. However, the present invention is not limited to such a procedure, but the two-stage through-hole 13 can also be formed by the following procedure.

For example, using the photoresist 60 for dry-etching having the opening 61 as a mask, a hole is formed which has a perpendicular cylindrical wall surface with a diameter of 20 µm in a Bosch mode from the second surface side of the semiconductor substrate 10 close to the I/O pad 12. Next, the first hole 13a having a diameter larger than that of the opening 61 of the photoresist 60 for dry-etching is formed on the second surface side in an RIE mode. Thereby, it is also possible to form the two-stage through-hole 13 having a wine glass shape.

In addition, in the first embodiment, an aluminum layer was formed on the insulating film 14 of the two-stage through-hole 13 by sputtering and the through-electrode 15 was formed. In the second embodiment, a diffusion prevention layer was formed on the insulating film 14 of the two-stage through-hole 13 by sputtering, and the through-electrode 15 was formed by plating copper. However, a metal for forming a conductive layer of the through-electrode 15 according to the first and second embodiments can be appropriately replaced and used. In addition, as the metal for forming the conductive layer of the through-electrode 15, metals other than Al, copper or the like can also be appropriately used.

The cross-section perpendicular to an axis of the two-stage through-hole 13 of the semiconductor device according to the present invention can be formed in a circular, elliptical, or quadrilateral shape.

In addition, the photoresist 60 for dry-etching which is used in the present invention is not limited to a photoresist, but a resist capable of being drawn by an electron beam, or a resist for dry-etching capable of forming the opening 61 using other methods can be used.

A material of the semiconductor substrate 10 of the semiconductor device according to the present invention is not limited to a silicon substrate. With respect to the semiconductor substrate 10 of other materials, the two-stage through-hole 13 having the same shape as that in the above embodiment is formed on the I/O pad 12, a layer of the insulating film 14A is formed on the inner wall surface using a chemical vapor deposition method, and overall dry-etching is performed, thereby allowing a structure in which the insulating film 14A located on the I/O pad 12 is removed to be formed while the insulating film 14 is left on the wall surface of the two-stage through-hole 13. The two-stage through-hole 13 allows the high-quality through-electrode 15 of a uniform metal film to be formed.

The present invention can be applied to a semiconductor device which is capable of being manufactured at low cost and which includes a through-electrode having high connection reliability, and a method for manufacturing the same.

The invention claimed is:

1. A semiconductor device, comprising:
   a semiconductor substrate comprising a first surface and a second surface which is an opposite side to the first surface;
   an integrated circuit formed on the first surface of the semiconductor substrate and having a solid-state imaging element;
   an I/O pad formed on the first surface and electrically connected to the integrated circuit;
   a two-stage through-hole formed in the semiconductor substrate, the two-stage through-hole comprising a first shape portion having a tapered shape which has an inner wall surface and of which a diameter of an opening becomes smaller toward a bottom of the hole from the second surface to a predetermined position of the semiconductor substrate in a thickness direction, and comprising a second shape portion having a cylindrical shape which extends from the first shape portion to the I/O pad on the first surface;
   a color filter layer formed on the first surface of the semiconductor substrate and comprising, in a region in which pixels of the solid-state imaging element are formed, an RGB color filter corresponding to each of the pixels and a passivation layer;
   a micro-lens array formed on the color filter layer at a location corresponding to the solid-state imaging element;
   a cavity dam formed on the I/O pad and surrounding a lateral side of the micro-lens array and the color filter layer;
   a glass substrate formed on the cavity dam;
   an inorganic insulating film formed on the inner wall surface of the two-stage through-hole and the second surface;
   a through-electrode of a metal layer formed on an exposed part of the I/O pad and is formed on the inner wall surface of the two-stage through-hole; and
   a wiring pattern formed on the second surface and connected to the through-electrode.

2. The semiconductor device according to claim 1, wherein a depth of the second shape portion is equal to or less than four times a diameter of the second shape portion.

3. The semiconductor device according to claim 1, wherein the first shape portion comprises a tapered wall surface, and in a cross-section of the first shape portion, the tapered wall surface has a tilt with respect to the second surface which is equal to or greater than 60 degrees and equal to or less than 80 degrees.

4. The semiconductor device according to claim 1, further comprising a solder resist protecting the second surface and filled into the first shape portion.

5. The semiconductor device according to claim 1, wherein the I/O pad which is exposed is formed by an overall etching process without using a resist mask.

6. The semiconductor device according to claim 1, wherein a maximum depth of the through-electrode reaches a upper surface of the I/O pad.

7. A method for manufacturing a semiconductor device, comprising:
  forming, on a first surface of a semiconductor substrate,
    an integrated circuit,
    an I/O pad electrically connected to the integrated circuit,
    a color filter layer comprising, in a region in which pixels of a solid-state imaging element of the integrated circuit are formed,
    an RGB color filter corresponding to each of the pixels and a passivation layer, and
    a micro-lens array formed at a place corresponding to the solid-state imaging element on the color filter layer;
  forming a pattern of a resist for dry-etching having an opening on a second surface which is an opposite side to the first surface;
  forming a cavity dam on the I/O pad so as to surround a lateral side of the micro-lens array and the color filter layer;
  forming a glass substrate on the cavity dam;
  forming a first shape portion opened from the second surface to a predetermined position of the semiconductor substrate in a thickness direction so that a diameter of an opening of the first shape portion in the second surface is larger than a diameter of an opening of the resist for dry-etching and the first shape portion is formed in a tapered shape of which a hole diameter of the first shape portion becomes smaller toward a bottom of the first shape portion, by dry-etching the semiconductor substrate in an RIE mode using a dry-etching apparatus using the resist for dry-etching as a mask;
  forming a second shape portion comprising a cylindrical wall surface with the same diameter as that of the opening of the resist for dry-etching which extends from the bottom of the first shape portion to the I/O pad, by performing dry-etching in a Bosch mode using the dry-etching apparatus using the resist for dry-etching as a mask;
  forming an inorganic insulating film using a chemical vapor deposition method, on an inner wall surface of a two-stage through-hole constituted by the first shape portion and the second shape portion and on the second surface;
  dry-etching an entire surface of the insulating film, and removing the insulating film located on the I/O pad and exposing a part of the I/O pad while leaving the insulating film on the inner wall surface of the two-stage through-hole and on the second surface;
  forming a through-electrode by forming a metal film on the exposed part of the I/O pad and on the inner wall surface of the two-stage through-hole; and
  forming a wiring pattern on the second surface which is connected to the through-electrode.

8. The method for manufacturing a semiconductor device according to claim 7, further comprising:
  forming a solder resist for protecting the second surface, and
  filling the solder resist in the first shape portion.

9. The method for manufacturing a semiconductor device according to claim 7, wherein the I/O pad is exposed by an overall etching process without using a resist mask.

* * * * *